United States Patent
Hushek

[11] Patent Number: 6,025,718
[45] Date of Patent: Feb. 15, 2000

[54] RF POWER CALIBRATION FOR AN MRI SYSTEM USING LOCAL COILS

[76] Inventor: Stephen G. Hushek, 945 Greenridge Ter., Brookfield, Wis. 53045

[21] Appl. No.: 09/056,466

[22] Filed: Apr. 7, 1998

[51] Int. Cl.[7] .................................................. G01V 3/00
[52] U.S. Cl. .......................... 324/316; 324/309; 324/307; 600/410
[58] Field of Search .................................... 324/309, 307, 324/312, 314, 316

[56] References Cited

U.S. PATENT DOCUMENTS

| | | | |
|---|---|---|---|
| 4,443,760 | 4/1984 | Edlstein et al. | 324/309 |
| 4,806,866 | 2/1989 | Maier et al. | 324/313 |
| 5,001,428 | 3/1991 | Maier et al. | 324/309 |
| 5,107,215 | 4/1992 | Schaefer et al. | 324/314 |

*Primary Examiner*—Christine K. Oda
*Assistant Examiner*—Brij B. Shrivastav
*Attorney, Agent, or Firm*—Barry E. Sammons; Christian G. Cabou; Phyllis Y. Price

[57] ABSTRACT

An MRI system performs a calibration prescan in which NMR projection signals are produced using a calibration pulse sequence. The readout gradient employed during the acquisition of each NMR projection signal is rotated during the signal sampling such that the projection angle changes during the acquisition. The center of the field of view is weighted more heavily in the calculation of the optimal RF transmit power to provide a more accurate setting when using local coils.

15 Claims, 5 Drawing Sheets

RF POWER CALIBRATION FOR AN MRI SYSTEM USING LOCAL COILS

BACKGROUND OF THE INVENTION

The field of the invention is nuclear magnetic resonance (NMR) systems and methods and, more particularly, systems for calibrating the RF transmit section of an NMR imaging system.

NMR imaging employs a combination of pulsed magnetic field gradients and pulsed radio frequency fields to obtain NMR imaging information from nuclear spins situated in selected regions of a sample to be imaged. The sample is typically positioned in a static magnetic field effective to polarize nuclear spins having a net magnetic moment so that a greater number of spins align with the polarizing magnetic field and add to produce a net magnetization. The individual polarized nuclear spins, and hence, the net magnetization M, resonate, or precess about an axis of the polarizing magnetic field at a frequency equal to a gyromagnetic constant times the magnitude of the magnetic field. This relationship is known as the Larmor relationship. A gyromagnetic constant exists for each NMR isotope. For a hydrogen nucleus (the most abundant atomic nucleus in a living body), the gyromagnetic constant is about 42.58 MHz/Tesla. With a magnetic field of about 1.5 Tesla, for example, the resulting resonant frequency for hydrogen nuclei predicted by the Larmor relationship is about 63.9 MHz.

In order to obtain a detectable NMR signal, the net magnetization of the nuclear spins is rotated away from coincidence with the axis of the polarizing magnetic field. Rotation is performed using a radio frequency excitation field of the same frequency as that determined by the Larmor relationship. The angle through which the net magnetization is rotated, or "flipped", is related to the field strength of the radio frequency excitation signal and to its duration. At the end of the radio frequency excitation pulse, the nuclei, in relaxing to their normal spin conditions, generate a decaying signal at the same radio frequency as that used for excitation. This NMR signal is picked up by a receive coil, amplified and processed by the NMR system.

As noted above, the angle through which the net magnetization is rotated depends on the radio frequency field strength and duration. NMR imaging generally requires that the net nuclear magnetization be rotated by some specified angle. Rotation to angles varying from these specific angles can produce a variety of problems in the reconstructed image. A full discussion of such problems and one solution therefor is given in U.S. Pat. No. 4,443,760, the disclosure of which is incorporated herein by reference.

Besides adding ghost artifacts to the received signal, errors in radio frequency field strength and pulse duration substantially reduce the amplitude of the received NMR signal. Since the received radio frequency NMR signal is small at best, reduction thereof, with a concomitant degradation in signal-to-noise ratio, is not desirable. Errors in radio frequency field strength can also affect image contrast in low flip angle gradient recalled echo sequences. The flip angle determines the relative proportions of T1 and T2 contrast. Errors in the flip angle could even produce the opposite of the intended contrast, yielding a T2-weighted image when a T1-weighted image was desired.

The combination of radio frequency field strength and pulse duration required to produce a particular rotation of net magnetization varies from object to object being imaged. In general, the more massive the body to be imaged, the higher the field strength and/or pulse duration. Also, the required field strength and duration varies with the type of material through which the exciting radio frequency pulse must travel to excite the material being imaged. When the body being imaged is a portion of a human anatomy, for example, the excitation by the radio frequency field varies with patient weight, the portion of the body being imaged, and the proportion of body fat, among other things.

Before the commencement of each NMR scan, it is common practice to adjust the frequency of the RF transmitter and receiver to insure that the RF excitation field is at the optimal Larmor frequency. Such a procedure is disclosed in U.S. Pat. No. 4,806,866, which is entitled "Automatic RF Frequency Adjustment For Magnetic Resonance Scanner", and which describes a calibration sequence that automatically determines the best RF transmitter and receiver frequency at the beginning of each NMR scan.

Similarly, before the commencement of each NMR scan, it is common practice to adjust the strength of the transmitted RF excitation field and the gain of the RF receiver so that accurate 90° and 180° flip angles are produced by the RF excitation field pulses. Methods for making this adjustment automatically are also well known and used in all commercially available MRI systems.

While the above described techniques insure that the RF excitation pulses have the optimal frequency, strength and duration to evoke the desired NMR signal, this does not necessarily mean that the expected RF excitation field will be produced uniformly throughout the region of interest, or that the resulting NMR signals will be received uniformly from all locations in the region of interest. Indeed, most transmit coils are loaded by the subject being studied, and the RF fields produced are not homogeneous. This is particularly true of so-called local coils which are relatively small coils that are designed to image specific, relatively small regions of human anatomy.

Prior RF power calibration methods perform a prescan sequence in which one or more NMR measurements are performed to determine the optimal RF power setting. Typically, a projection acquisition is performed in which a spin echo pulse sequence is used, but no phase encoding gradient is applied. The acquired NMR signal is an accumulation of the spin signals produced throughout the field of view of the measurement and these spin signals are weighted evenly regardless of their location. Such uniform sampling of the NMR signal level is appropriate when the prescribed scan uses the imager's whole-body rf coil that is designed to produce a homogeneous transmit and receive field throughout the entire field of view.

When local coils are prescribed, prior RF power calibration methods do not optimize the RF power setting for the small, local region of interest these coils are designed to image. Local coils enhance the level of the NMR signals received from a small region adjacent to the coils, but their response falls off drastically for signals located further from the coil. A calibration method which relies on a projection measurement that evenly weights signals throughout the field of view will not accurately set the rf power for the region of interest, which may or may not be immediately adjacent to the coil.

SUMMARY OF THE INVENTION

The present invention is a method for calibrating the RF transmit power on an NMR system such that the optimal RF excitation field is produced in a region of interest. More specifically, the present invention is a calibration prescan in which an NMR projection measurement is performed using a readout gradient that rotates about an axis substantially through the region of interest as the prescan NMR signal is sampled. The acquired data is weighted such that, signals from the central region around the axis of rotation contribute proportionately more to the resulting acquired NMR signal, and the RF power is more accurately calibrated for this central region of interest.

A general object of the invention is to improve the RF power calibration of an NMR system when a local coil is employed. The sweet spot of the local coil may not be located at the region of interest and the rotating calibration measurement of the present invention provides a more accurate indication of the RF power required in the region of interest

DESCRIPTION OF THE PREFERRED EMBODIMENT

Figure 1:
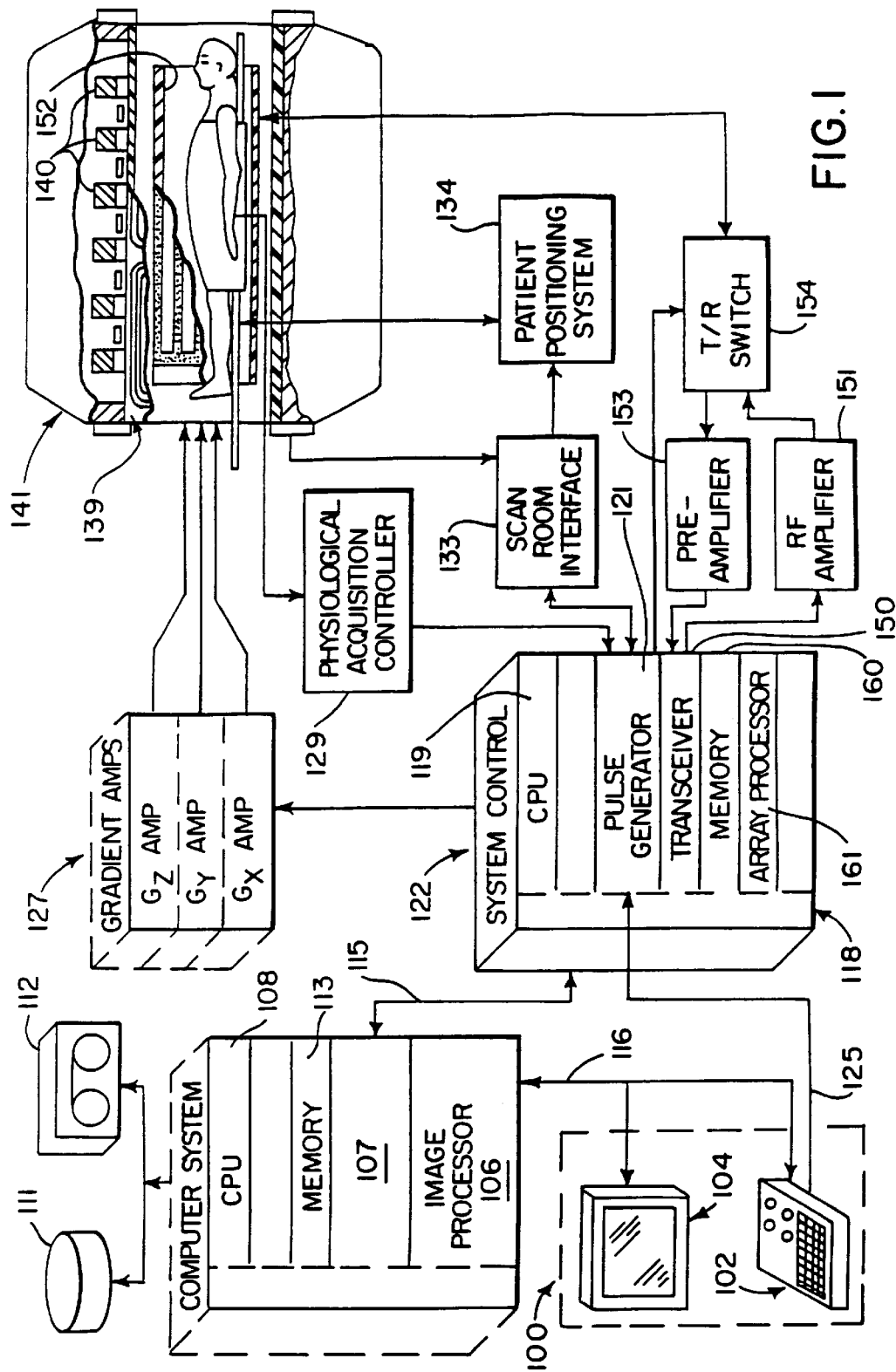
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate local RF coil (for example, a head coil or surface coil) to be used in either the transmit or receive mode. It is the use of such local coils with their non-homogeneous transmit/receive fields that gives rise to the present invention.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
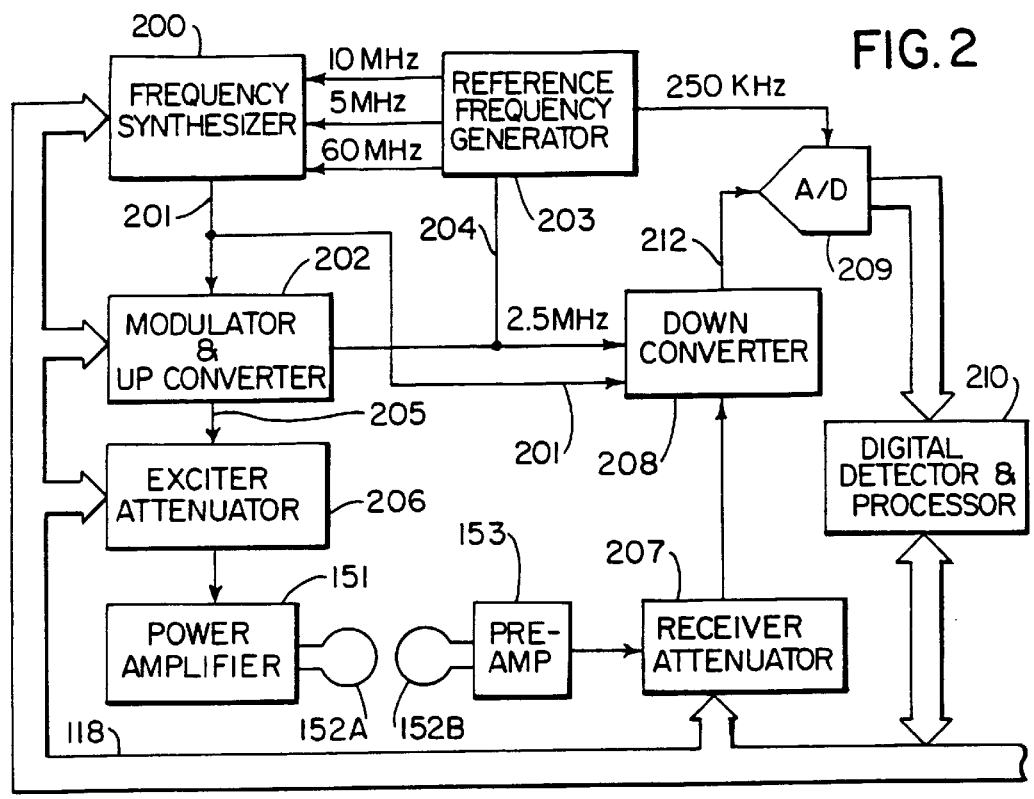
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single coil. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. It is the setting of this transmit attenuation TA that is the subject of the prescan calibration process discussed below. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIGS. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 205 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

The present invention is a procedure for determining the value of the transmit attenuation command (TA) which determines the magnitude of the RF excitation signal produced by the scanner system. This procedure is performed under the direction of a prescan program which is executed by the system control 122 at the beginning of each scan of a patient. The output of this procedure is a value for TA which will produce the optimal RF field at the region of interest to the physician. This prescan method employs a prescan measurement pulse sequence which is depicted in FIG. 3 and will now be described.

Figure 3:
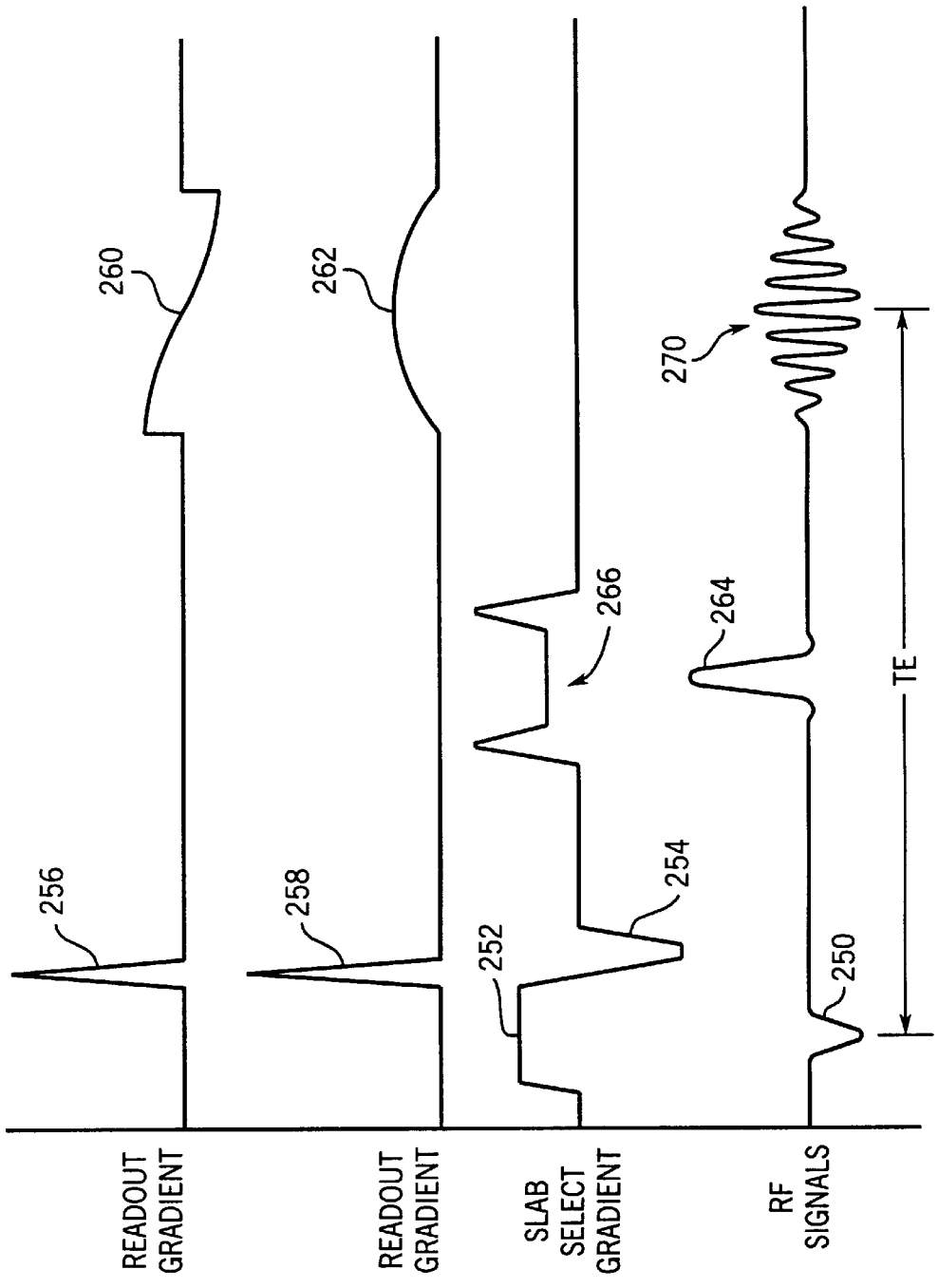
FIG. 3 is a graphic representation of the pulse sequence performed by the MRI system of FIG. 1 to practice the calibration prescan method of the present invention.

Referring particularly to FIG. 3, the prescan measurement pulse sequence is essentially a spin echo pulse sequence with two important differences: no phase encoding gradient is applied; and a rotating readout gradient is used. More specifically, the prescan measurement pulse sequence produces a 90° RF excitation pulse 250 in the presence of a slab select gradient produced by pulse 252. As is well known in the art, the strength of the slab select gradient 252 and the frequency and bandwidth of the RF excitation pulse 250 are chosen to locate the excited slab through the desired region of interest in the patient and to have a thickness that encompasses the volume prescribed by the scan.

After excitation, a rephasing pulse 254 is produced by the slab select gradient, and pre-phasing gradient pulses 256 and 258 are produced by first and second readout gradients. The first and second readout gradients (e.g. $G_x$ and $G_y$) are perpendicular to the slab select gradient (e.g. $G_z$) and they are perpendicular to each other. The rephasing gradient pulse 254 is one-half the size of the slab select gradient pulse 252, and the pre-phasing readout gradient pulses 256 and 258 are equal in size to the first half of respective readout gradient pulses 260 and 262.

After a time period TE/2 an RF refocusing pulse 264 is applied in the presence of a slab select gradient pulse 266. The same slab is excited, but the flip angle of the refocusing RF pulse 264 is selected to be 180° to invert the spin magnetization and produce an NMR echo signal 270 at time TE. As will be described in more detail below, the NMR echo signal 270 emanating from spins in the excited slab is acquired during the application of a rotating readout gradient produced by first and second readout gradient pulses 260 and 262.

Figure 4:
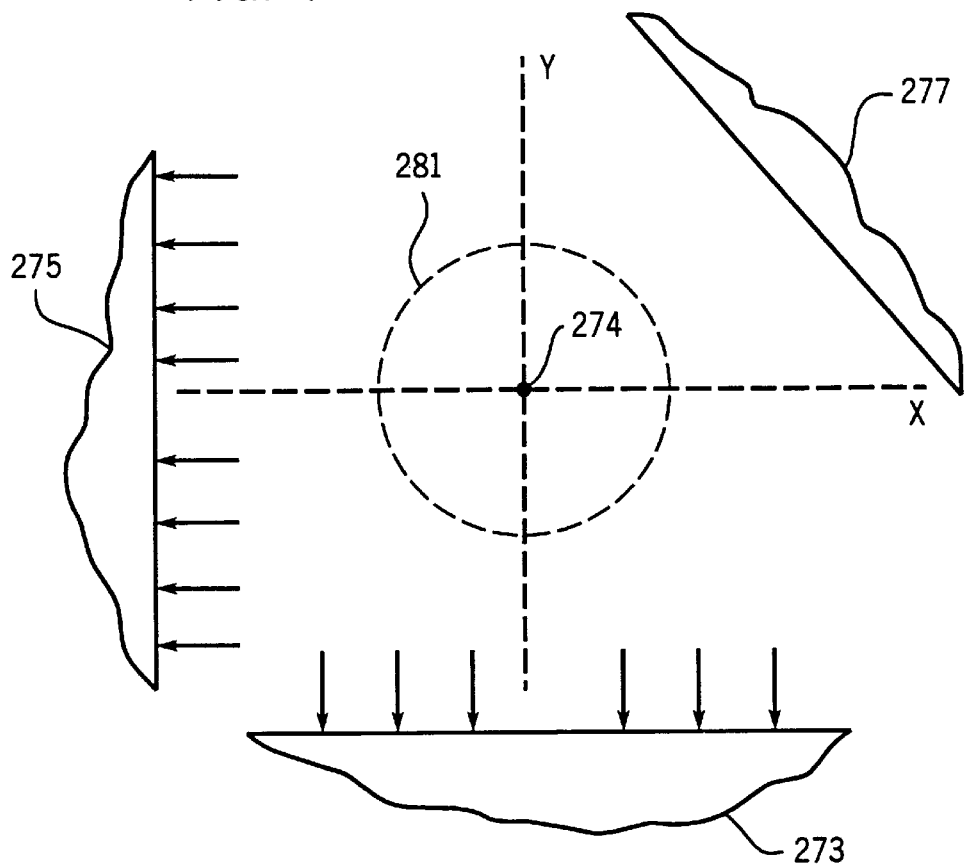
FIG. 4 is a pictorial representation of projection signals acquired at different readout gradient orientations.

Before discussing the rotating readout gradients 260 and 262, a conventional "fixed" readout gradient used in prior calibration methods will be described. As illustrated in FIG. 4, if a readout gradient is oriented along the x axis and a conventional rectangular readout gradient pulse is produced, the acquired echo signal 270 would be frequency encoded to indicate a projection signal 273. This projection signal 273 is the sum of all the spin signals in the field of view as seen from one angle about a central axis 274. If the readout gradient is changed to be oriented along the y axis, a projection signal 275 is produced in which the sum of all the spin signals are viewed from another angle perpendicular to the orientation of the first projection signal 273. By applying two orthogonal (e.g. x and y axis) readout gradients simultaneously, a projection signal such as that at 277 can be acquired at any angle about the central axis 274. Regardless of its direction, when a fixed readout gradient is used the NMR the spin signals are sampled uniformly throughout the field of view from a single angle. As a result, NMR spin signals emanating from a central region 281 are weighted equally with spin signals from the surrounding peripheral regions of the field of view when measuring the total power or energy in the received NMR projection signal.

An important aspect of the present invention is that the projection angle produced by the applied readout gradient changes during the acquisition of the NMR signal 270. In the preferred embodiment this is accomplished by changing the amplitudes of the first and second readout gradient pulses 260 and 262 in a sinusoidal manner. The first readout gradient pulse 260 is varied in amplitude in a cosine pattern and the second readout gradient pulse 262 is varied in a sine wave pattern. Only one-half of the cosine and sine wave patterns are produced during the readout, and as a result, the projection angle is smoothly and uniformly rotated 180° about the central axis 274 during the readout of the NMR echo signal 270.

Figure 5:
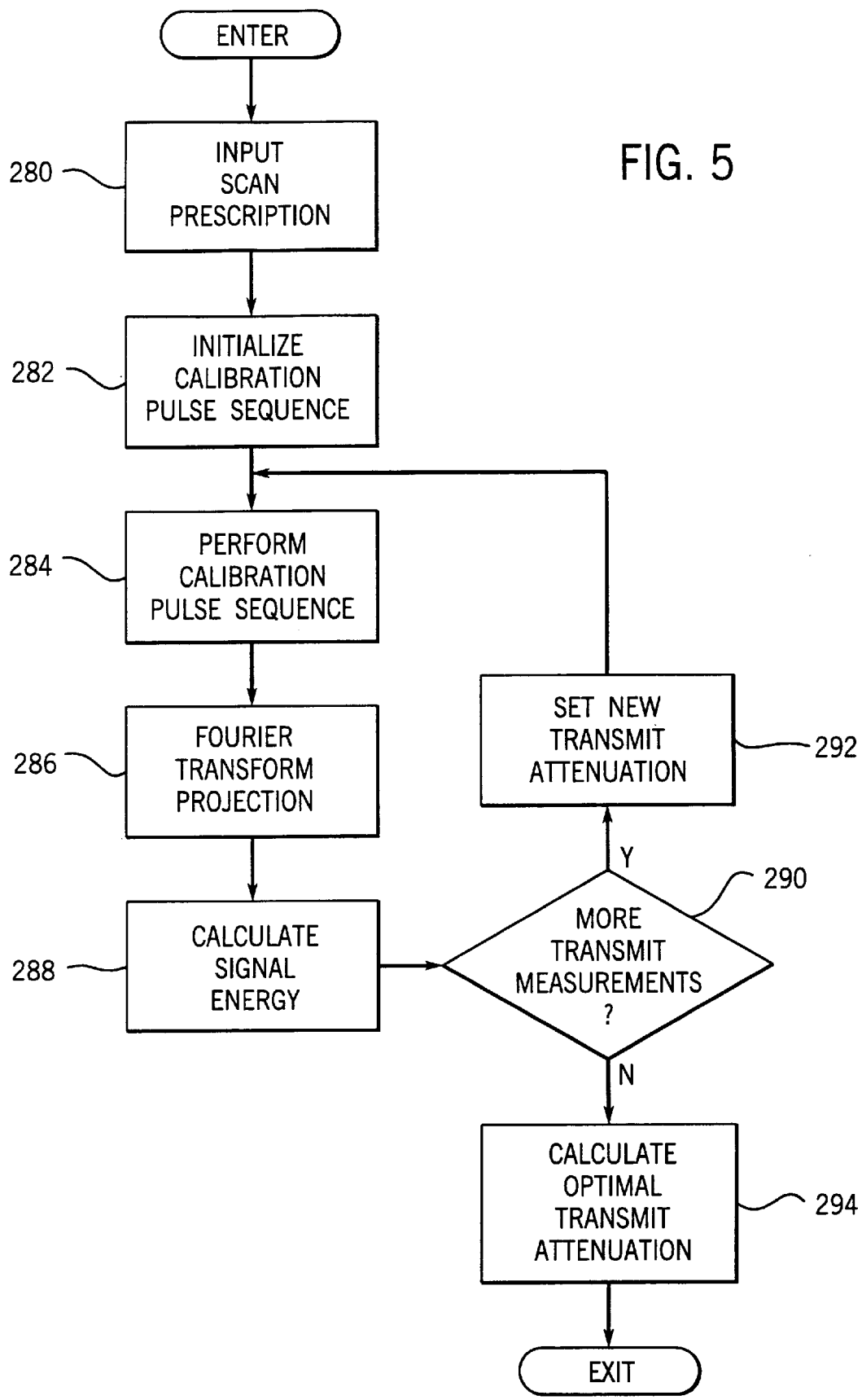
FIG. 5 is a flow chart of the prescan calibration process employed in the preferred embodiment.

Referring particularly to FIG. 5, the prescan program is entered and the parameters which describe the prescribed scan are input at process block 280. Some of these scan parameters are then used to initialize the above described calibration pulse sequence at process block 282. For example, the location and size of the region of interest are employed to set the RF pulse frequency and bandwidth as well as the slice select gradient which encompass this region of interest. It will be recognized by those skilled in the art that the receiver frequency will need to be modulated to maintain the ROI in the center of the projection axis if the ROI is not located on the slice select axis. Also, patient sex and weight as well as the part of the anatomy being imaged may be employed to calculate an initial setting of the transmit attenuation command (TA).

A loop is then entered in which the signal energy produced by a series of transmit calibration measurements are made at different transmit attenuation (TA) settings. The calibration pulse sequence of FIG. 3 is performed at process block 284 with the initial TA setting, and the acquired NMR echo signal 270 is Fourier transformed into the frequency domain at process block 286. This frequency domain projection may be filtered to reduce noise and then the energy of the projection signal is calculated at process block 288. There are a number of methods for performing this energy calculation, but in the preferred embodiment the magnitude of the central frequency component (or "bin") is calculated from its I and Q components. Because the readout gradient is rotated during the acquisition of the NMR echo signal 270, the signals from the central part 280 of the field of view will contribute far more weight to this energy calculation. Further processing of the projection data allows the data from the center of the ROI to contribute even more heavily to the energy calculation. For example, the central bin samples the entire FOV and the adjacent bins to either side sample everything but the center of the ROI. The signal contribution of the adjacent bins may be subtracted from the central bin leaving nothing but the contribution from the center. If the region of interest to the physician is centered in this field of view, this insures that the power calibration is made at the region of interest regardless of the transmit/receive characteristics of the local coil being used.

Figure 6:
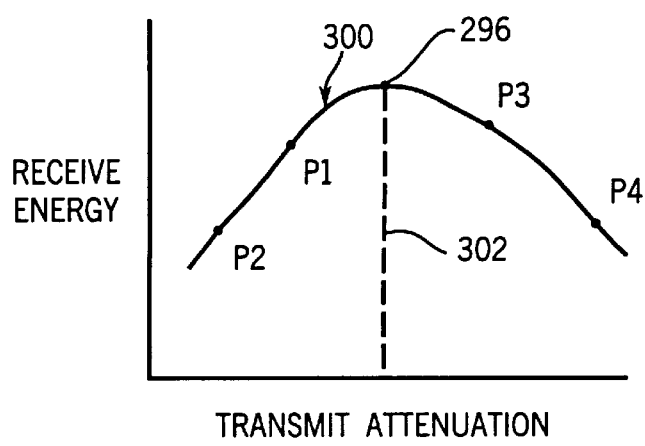
FIG. 6 is a graphic representation of receive energy versus transmit attenuation value used to explain the present invention.

Further transmit measurements at different TA settings are made until a decision is made at block 290 that sufficient points on an energy curve 300 have been made to calculate the optimal TA setting. As shown in FIG. 6, the energy curve 300 peaks at the optimal transmit attenuation value indicated by dashed line 302, and sample transmit measurements should be obtained on both sides of this peak as indicated by points P1–P4. Various well known strategies can be employed to set the new transmit attenuation (TA) values at process block 292 to ensure that the energy curve 300 is adequately sampled on both sides of the peak in as few measurements as possible.

When the necessary transmit measurements have been acquired as determined at decision block 290, the optimal transmit attenuation setting is then calculated at process block 294. This calculation fits a curve through the sample energy points (e.g. points P1–P4) and then finds or extrapolates to the peak value of this curve (e.g. point 296). The transmit attenuation value TA which will produce this peak value is then output and used in the subsequent patient scan.

I claim:

1. A method for acquiring NMR calibration data for use in calibrating an NMR system, the steps comprising:
    a) producing transverse magnetization in a region of interest located in the polarizing magnetic field of the NMR system by producing an RF excitation pulse;
    b) receiving an NMR signal resulting from the transverse magnetization and sampling its magnitude to produce projection signal data;
    c) producing a readout gradient during the sampling of the received NMR signal to frequency encode the received NMR signal, the direction of the readout gradient being otated during the sampling of the received NMR signal; and
    d) Fourier transforming the projection signal data to produce the NMR calibration data.

2. The method as recited in claim 1 in which the readout gradient is produced by sinusoidally varying the amplitude of two orthogonal gradient fields during the sampling of the received NMR signal.

3. The method as recited in claim 2 in which the two orthogonal gradient fields are produced by two corresponding gradient pulses whose amplitudes vary sinusoidally.

4. The method as recited in claim 3 in which the sinusoidal variations in the gradient pulse amplitudes are substantially 90° out of phase with each other.

5. The method as recited in claim 4 in which the gradient pulse amplitudes vary sinusoidally through at least 180°.

6. The method as recited in claim 1 which includes:
    e) producing an RF refocusing pulse after step a) such that the NMR signal received in step b) is a spin echo NMR signal.

7. The method as recited in claim 1 which includes producing a slice select gradient while the RF excitation pulse is produced.

8. The method as recited in claim 6 which includes producing slice select gradient pulses while the respective RF excitation pulse and the RF refocusing pulse are produced.

9. The method as recited in claim 1 in which the calibration data is produced from a central portion of the Fourier transformed projection signal data.

10. The method as recited in claim 9 in which the calibration data is produced by subtracting peripheral portions of the Fourier transformed projection signal data from said central portion.

11. A method for calibrating an NMR system, the steps comprising:
    a) producing an RF excitation field to produce transverse magnetization in a region of interest located in the polarizing magnetic field of the NMR system;
    b) acquiring an NMR signal produced by the transverse magnetization during a readout period;
    c) producing a readout magnetic field gradient in the region of interest during the readout period, the direction of the readout magnetic field gradient being rotated during the readout period;
    d) Fourier transforming the acquired NMR signal to produce calibration data; and
    e) calibrating the NMR system using the calibration data.

12. The method as recited in claim 11 in which the readout magnetic field gradient is produced by sinusoidally varying the amplitude of two, orthogonal magnetic field gradients during the readout period.

13. The method as recited in claim 11 in which the calibration data is produced by calculating the energy of the Fourier transformed NMR signal.

14. The method as recited in claim 11 in which step e) is performed by repeating steps a–d) with different RF excitation field strength.

15. The method as recited in claim 14 in which the calibrator data is produced by calculating the energy of the Fourier transformed NMR signal, and the NMR system is calibrated by determining the RF excitation field strength that will produce calibration data having the maximum energy.

* * * * *